United States Patent [19]
Nestler

[11] Patent Number: 5,872,469
[45] Date of Patent: Feb. 16, 1999

[54] SWITCHED CAPACITOR CIRCUIT ADAPTED TO STORE CHARGE ON A SAMPLING CAPACITOR RELATED TO A SAMPLE FOR AN ANALOG SIGNAL VOLTAGE AND TO SUBSEQUENTLY TRANSFER SUCH STORED CHARGE

[75] Inventor: Eric Nestler, Harvard, Mass.

[73] Assignee: Analog Devices, Inc., Norwood, Mass.

[21] Appl. No.: 626,136

[22] Filed: Apr. 5, 1996

[51] Int. Cl.[6] ................................................. G11C 27/02
[52] U.S. Cl. ............................................. 327/91; 327/390
[58] Field of Search .............................. 327/91, 94, 337, 327/390, 391, 589, 537, 554, 333; 330/9; 341/122

[56] References Cited

U.S. PATENT DOCUMENTS

| | | | |
|---|---|---|---|
| 3,714,466 | 1/1973 | Spence | 307/237 |
| 5,084,634 | 1/1992 | Gorecki | 307/355 |
| 5,134,488 | 7/1992 | Sauer | 358/213.11 |
| 5,140,182 | 8/1992 | Ichimura | 327/536 |
| 5,347,171 | 9/1994 | Cordoba et al. | 327/536 |
| 5,521,546 | 5/1996 | Kim | 327/390 |
| 5,554,951 | 9/1996 | Gough | 327/91 |
| 5,646,570 | 7/1997 | Blodgett | 327/362 |

FOREIGN PATENT DOCUMENTS

| | | |
|---|---|---|
| 0130273 A3 | 1/1985 | European Pat. Off. . |
| 0154370 A1 | 9/1985 | European Pat. Off. . |
| 0 405 407 A3 | 6/1990 | European Pat. Off. . |

*Primary Examiner*—Timothy P. Callahan
*Assistant Examiner*—My-Trang Nu Ton
*Attorney, Agent, or Firm*—Fish & Richardson P.C.

[57] ABSTRACT

A sampling capacitor interface circuit for storing charge on a sampling capacitor related to a sample of an input signal voltage during a charging phase and to transfer the stored charge to an output during a charge transfer phase, such input signal having bipolar voltages within a range above and below an input signal common mode voltage. The interface circuit includes a transistor having: an input electrode fed by the input signal; an output electrode coupled to the sampling capacitor; and, a control electrode. A controller is provided for producing a control signal having a first voltage during the charging phase and a second voltage during the charge transfer phase, such voltages being a unipolar voltage referenced to the input signal common mode voltage. A bias circuit is coupled to the input signal and has a level shifting capacitor coupled between the controller and the control electrode for storing a voltage during the charge transfer phase and for shifting the first voltage by the stored voltage during the charging phase to provide a voltage at the control electrode with a level sufficiently below the input signal common mode voltage to bias the transistor to a conducting condition during the charging phase over the range of input signal voltages.

20 Claims, 2 Drawing Sheets

FIG. 2A Ph1 — Transfer — PRIOR ART

FIG. 2B Ph2 — Sampling — PRIOR ART

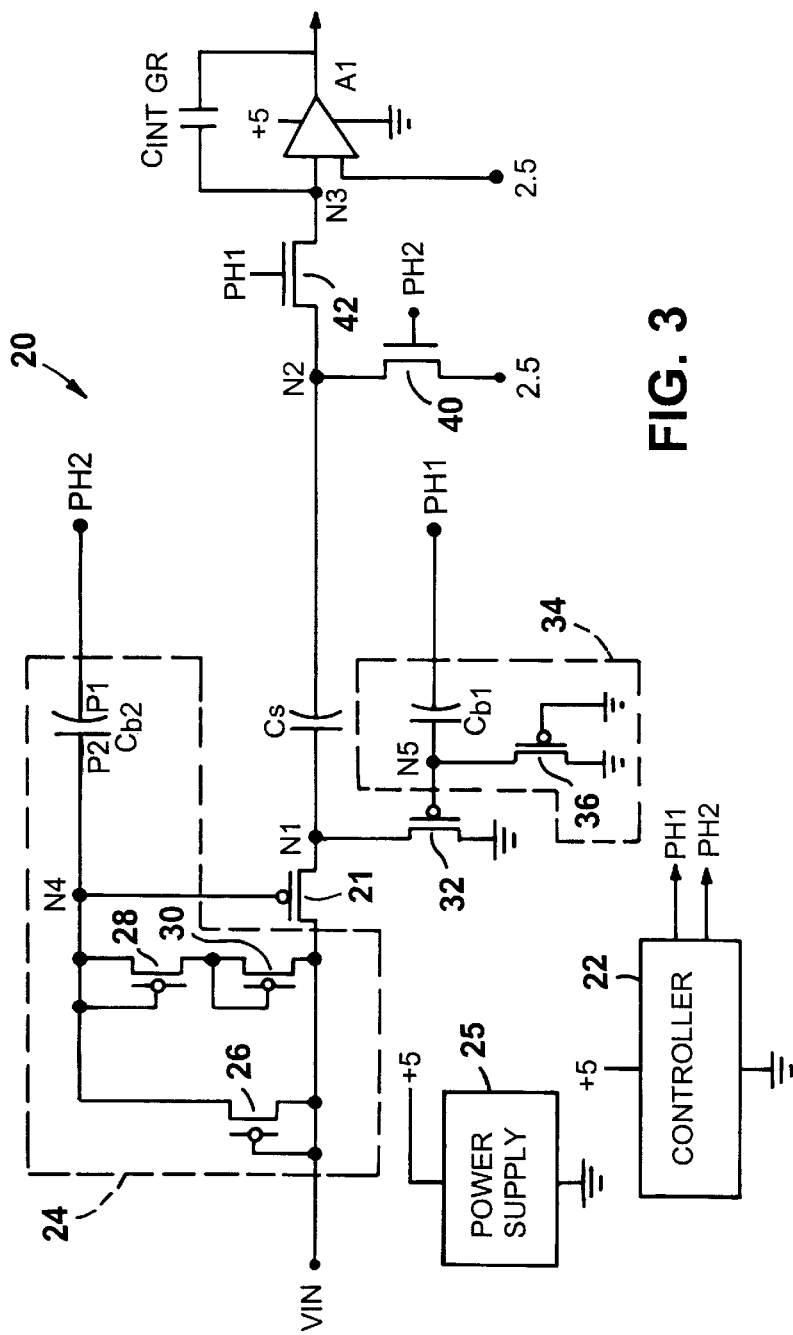
FIG. 3
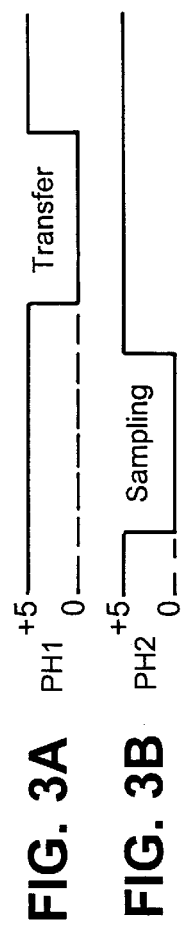
FIG. 3A
FIG. 3B

SWITCHED CAPACITOR CIRCUIT ADAPTED TO STORE CHARGE ON A SAMPLING CAPACITOR RELATED TO A SAMPLE FOR AN ANALOG SIGNAL VOLTAGE AND TO SUBSEQUENTLY TRANSFER SUCH STORED CHARGE

BACKGROUND OF THE INVENTION

This invention relates generally to switched capacitor circuits and more particularly to circuits adapted to store charge on a sampling capacitor related to a sample of an analog signal voltage during a charging, or sampling phase and to transfer the stored charge to an output during a charge transfer phase.

As is known in the art, switched capacitor circuits have a variety of applications. For example, in analog to digital converters (ADCs) which are based on either capacitor digital to analog converters (DACs) or oversampling schemes, such as sigma-delta converters, an interface is typically required between the analog input signal voltage being converted into corresponding digital samples and the conversion architecture. The interface typically samples the analog signal voltage and stores such sampled voltage as a corresponding, proportional charge on a sampling capacitor. More particularly, the interface is provided between the analog voltage signal and the sampling capacitor. After storage, the stored charge is converted into a corresponding digital signal representative of the sampled analog input signal voltage by the conversion architecture. In a sigma-delta ADC architecture, the charge is stored on the sampling capacitor during a charging phase and is transferred to an output during a charge transfer phase for conversion. This charging/charge transfer phasing is provided by a switched capacitor circuit.

More particularly, as shown in FIG. 1 and as described in U.S. Pat. No. 5,134,401 issued Jul. 28, 1992 entitled "Delta Sigma Modulator Having Programmable Gain/Attenuation", inventors McCartney et al., assigned to the same assignee as the present invention, the subject matter thereof being incorporated by reference, the switched capacitor circuit 10 includes a sampling capacitor Cs and four transistors m1, m2, m3 and m4. The output of the switched capacitor circuit 10 is coupled to a summing node n3. During the charging phase, control signal Ph2 (FIG. 2B) at the gate electrodes of transistors m1, m2 places transistors m1 and m3 in a conducting condition and control signal Ph1 (FIG. 2A) at the gate electrodes of transistors m2, m3 places transistors m2 and m3 in a non-conducting condition. Thus, a charge packet, Cs*Vin is stored on sampling capacitor Cs at the end of the charging phase, where Vin is the analog input signal voltage. During the charge transfer phase, control signal Ph1 switches transistors m1 and m3 to the non-conducting condition and control signal Ph1 places transistors m2 and m3 in the conducting condition thereby transferring the charge packet stored on the sampling capacitor Cs to the summing node n3.

It should be noted that while the circuit in FIG. 1 is for a single ended analog input signal voltage for simplification, the actual implementation may be a fully differential analog input signal voltage. Thus, with this understanding, transistors m2 and m3 are connected to a reference voltage, VREF. The summing node n3 is at one input of an operational amplifier A1, say the non-inverting input, and the reference voltage VREF is at the other input, say the inverting input, of the operational amplifier A1. The reference voltage VREF is typically the common mode, or mid-range voltage of the analog input signal voltage. Thus, when the analog input signal voltage is a unipolar voltage (i.e., a voltage which varies with one polarity relative to ground potential, either a positive (+) voltage or a negative (−) voltage), VREF would be +2.5 volts.

In operation, when the analog input signal voltage is at the +2.5 volt, mid-range voltage, it is noted that node n1 is at this mid-range +2.5 volt level during both the charging phase and the charge transfer phase. Thus, there will be no net charge to the integrating capacitor when the analog input signal voltage is at the mid-range voltage. It should also be noted that when transistor m3 is in conduction during the charging phase, the voltage at the summing node n3 is equal to the reference voltage VREF at the other input to the operational amplifier A1.

It should be noted that, in some applications the analog input signal voltage to be converted into digital samples is produced as a bipolar voltage signal (i.e., a voltage which varies with both polarities relative to ground, both positive (+) and negative (−) voltages). In other applications, the analog signal is produced as a unipolar signal and is then fed to a signal conditioning circuit. The signal conditioning circuit may provide amplification and filtering to the analog input signal voltage. These signal conditioning circuits are usually easier, and less expensive to design when a bipolar voltage supply is used. A bipolar supply is a zero, or ground based voltage supply which provides a positive voltage (i.e., a voltage above ground) and a negative voltage (i.e., a voltage below ground). The conditioned signal, which has voltages above and below ground is then passed to the analog to digital converter (ADC). While the signal conditioning circuits are usually less expensive when a bipolar voltage supply is used, the ADC is typically less expensive when a unipolar, (i.e., 0 to 5 volt supply) is used. More particularly, it may be advantageous to use complementary metal oxide silicon (CMOS) transistor technology in fabricating the ADC and supplying the CMOS ADC with the unipolar voltage supply. Thus, if a bipolar voltage supply is used for the signal conditioning circuitry, the ADC, unipolar powered CMOS circuitry is now fed with a bipolar analog input signal voltage, i.e., the range of analog input signal voltages fed to the ADC will be both above and below ground.

It should be noted that if transistor m1 included a nMOS transistor within an n-type conductivity well of the semiconductor substrate, when the analog input signal voltage is negative, the analog input signal voltage would be clamped to the grounded substrate (i.e., the analog input signal voltage would be diode clamped to the grounded substrate). If a pMOS transistor were used for m1, while a negative analog input signal voltage would not produce diode clamping as with the NMOS transistor, a voltage several volts (i.e., about 2 volt) below the analog input signal voltage would be required at the gate electrode of transistor m1 to turn such transistor m1 to the conduction condition. Thus, when the analog input signal voltage is below ground, i.e., negative, a negative voltage is required at the gate electrode of transistor m1 to place such transistor m1 in the conducting condition. One technique used to provide such negative voltage is to use a bipolar voltage supply. Another technique is to shifted the voltage of the analog input signal voltage so that the voltage range fed to transistor m1 will only vary above ground; i.e., so that the voltage fed to transistor m1 will vary from +1.0 volts to +4.0 volts with VREF being +2.5 volts. One technique used to provide such voltage level shift to the analog input signal voltage is to provide a level shifting voltage. However, such level shifting voltage may tend to change with temperature and noise; unlike a more stable ground.

SUMMARY OF THE INVENTION

In accordance with the present invention, a sampling capacitor interface circuit is provided adapted to store charge on a sampling capacitor related to a sample of an input signal during a charging phase and to transfer the stored charge to an output during a charge transfer phase. The input signal is a bipolar voltage. The circuit includes a transistor having: an input electrode fed by the input signal; an output electrode coupled to the sampling capacitor; and, a control electrode. A controller is provided for producing a control signal having a first voltage during the charging phase and a second voltage during the charge transfer phase, such voltages being unipolar voltages. A bias circuit is coupled to the input signal and includes a level shifting capacitor coupled between the controller and the control electrode for storing a voltage during the charge transfer phase and for shifting the first voltage by the stored voltage during the charging phase to provide a voltage at the control electrode with a level sufficient to bias the transistor to a conducting condition during the charging phase over the range of input signal voltages.

With such an arrangement, the interface circuit is adapted to operate with a unipolar voltage supply.

In accordance with another feature of the invention, the bias circuit includes first diode and second diode means coupled between the input electrode and the control electrode. The first diode means is connected to conduct and provide a first threshold voltage drop relative to the input signal at the level shifting capacitor during the charge transfer phase and the second diode means is coupled to conduct and provide a second threshold voltage drop relative to the input signal voltage at the level shifting during a terminal portion of the charging phase.

In accordance with still another feature of the invention, a second transistor is provided having: an input electrode coupled to the output electrode of the first-mentioned transistor and to the sampling capacitor; an output electrode coupled to a common mode voltage of the input signal; and, a control electrode. The controller produces a second control signal having a first voltage during the charging phase and a second voltage during the transfer phase, such voltages being unipolar voltages referenced to the common mode voltage. A second bias circuit has a level shifting capacitor coupled between the controller and the control electrode of the second transistor for storing a voltage during the charging phase and for shifting the second voltage produced by the controller by the stored voltage during the charge transfer phase to provide a voltage at the control electrode of the second transistor with a level sufficient to bias the second transistor to a conducting condition during the charge transfer phase over the range of input signal voltages.

In accordance with yet another feature of the invention, the second bias circuit includes a diode means coupled between the control electrode of the second transistor and the common mode voltage to provide a threshold level at the level shifting capacitor of the second bias circuit relative to the common mode voltage during the charge transfer phase.

BRIEF DESCRIPTION OF THE DRAWING

FIGS. 2A and 2B are timing diagrams useful in understanding the operation of the switched capacitor circuit of FIG. 1;

FIG. 3 is a switched capacitor interface circuit according to the invention; and FIGS. 3A and 3B are timing diagrams useful in understanding the operation of the switched capacitor circuit of FIG. 3.

DESCRIPTION OF THE PREFERRED EMBODIMENTS

Figure 1:
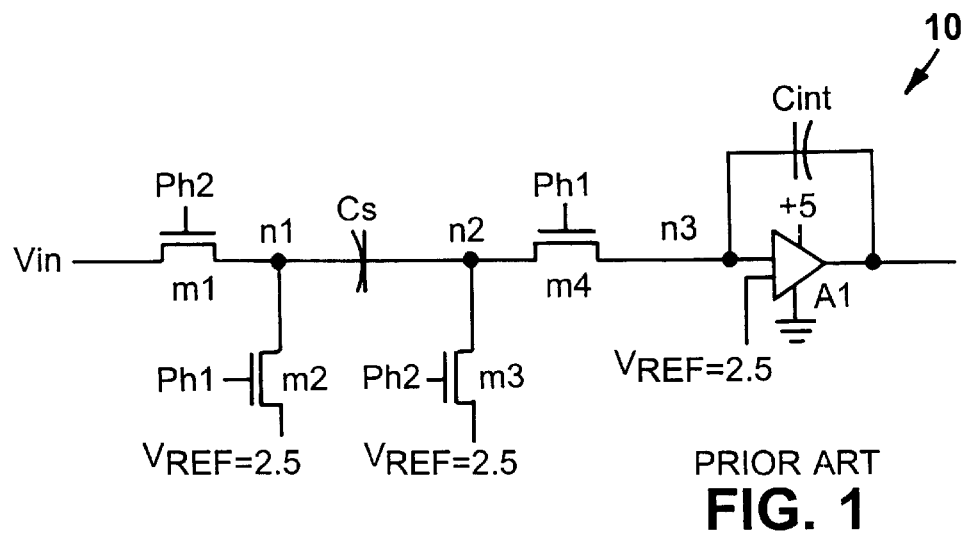
FIG. 1 is a switched capacitor interface circuit according to the prior art.

Referring now to FIG. 3, a switched capacitor interface circuit 20 is coupled between an analog input signal voltage, VIN, and a summing node N3. The summing node N3 provides the inverting input to operational amplifier A1. The non-inverting input is coupled to a reference voltage, VREF, here, +2.5 volts. An integrating capacitor CINTGR is coupled between the output of the operational amplifier A1 and the summing node, N3, as described in the above referenced U.S. Patent.

The switched capacitor interface circuit 20 is adapted to store charge on a sampling capacitor, Cs, related to a sample of an analog input signal voltage, Vin, during a charging, or sampling, phase and to transfer the stored charge to the summing node N3 during a subsequent charge transfer phase. The analog input signal voltage, Vin, has a range above and below a common mode voltage, here the common mode voltage of the input signal being ground. In the general case, the common mode voltage level of the input signal is the average, or dc level, of the input signal. Therefore, here the analog input signal is a bipolar voltage which here varies between −1volts and +1 volts. Thus, the mid-range, or common mode voltage is ground, or zero volts.

The switched capacitor circuit 20 includes a transistor 21, here a pMOS transistor having: an input electrode (i.e., a source or drain electrode) by the analog input signal voltage, Vin; an output electrode (i.e., a drain or source electrode) coupled to the sampling capacitor, Cs; and, a control (i.e., gate) electrode.

A controller 22 is provided for producing the control signals PH1 and PH2, shown in FIGS. 3A and 3B, respectively. The control signal PH1 has a first voltage, here ground, during the charge transfer phase and a second voltage, here +5 volts, during the charging, or sampling, phase. The control signal PH2 has a first voltage, here ground, during the charging, or sampling, phase and a second voltage, here +5 volts, during the charge transfer phase. Thus, the PH1, PH2 voltages produced by the controller 22, as well as the amplifier A1, are provided by a single (i.e., unipolar) voltage supply 25, here a voltage +5 volts reference to ground.

A bias circuit 24 is coupled to the analog input signal voltage, Vin. The bias circuit 24 includes a level shifting capacitor Cb2 coupled between the controller 22 and the control electrode of transistor 21 (via the control signal PH2) for storing a voltage during the charge transfer phase and for shifting the ground level voltage, produced by the control signal PH2, by the stored voltage during the charging phase. By shifting the ground level voltage produced by the control signal PH2 during the sampling, or charging phase, a voltage is produced at the control electrode of the transistor 21 during the charging phase with a level sufficiently below the common mode voltage, here 1.5 volts below ground, i.e., −1.5 volts, to bias the transistor 21 to a conducting condition during the charging phase over the range of analog input signal voltages; here the range −1volts to +1 volts.

More particularly, the bias circuit 24 includes first diode means 26 and second diode means 28, 30 coupled between the input electrode and the control electrode of transistor 21, as shown. The first diode means 26, here a pMOS transistor arranged as a diode, is connected to conduct and provide a first threshold voltage drop, VTH, here about 1 volt, relative to the analog input signal voltage at the level shifting capacitor Cb2 (i.e., at node N4) during an initial portion of the charging, or sampling, phase and the second diode means 28, 30, here a pair of serially connected pMOS transistors each arranged as diodes, is coupled to conduct and provide a second threshold voltage drop, 2VTH, here about 2 volts, to the analog input signal voltage during a terminal portion of the charging phase.

The circuit 20 includes a second transistor 32. The second transistor 32, here also a pMOS transistor, has: an input electrode coupled to the output electrode of the transistor 21 and to the sampling capacitor, Cs, at the node N1; an output electrode coupled to the common mode voltage of the input signal, here ground; and, a control (i.e., gate) electrode coupled to controller 22 via the control signal PH1 and to the input signal common mode level, here ground, through a diode connected transistor 36. As noted above in connection with FIG. 3A, the control signal PH1 has a second voltage during the charging, or sampling phase (i.e., here +5 volts) and a first voltage, here ground, during the transfer phase. These first and second voltages are unipolar voltages referenced to ground, i.e., the common mode voltage of the input signal.

A second bias circuit 34 has: a level shifting capacitor Cb1 coupled between the controller 22, via control signal PH1, and the control electrode of the transistor 32; and the diode connected transistor 36, as discussed above. The capacitor Cb1, stores a voltage during the charging phase and shifts the first voltage, (i.e., the ground voltage of the control signal PH2) by the voltage stored on the capacitor Cb1 during the charge transfer phase to provide a voltage at the control electrode of the transistor 32 during the transfer phase with a level sufficiently below the common mode voltage, i.e., below ground) to bias transistor 32 to a conducting condition during the charge transfer phase over the range of analog input signal voltages; i.e, the range here from −1volts to +1 volts. The diode connected transistor 36, here a pMOS transistor arranged as a diode, is connected to conduct and provide a threshold voltage drop, VTH, here about 1 volt, relative to the analog input signal common mode voltage (i.e., ground) at the level shifting capacitor Cb1 (i.e., at node N5) during an initial portion of the charge transfer phase. It is noted that while a diode means similar to the second diode means 28, 30 may also be used in parallel with the diode connected transistor 36, here, however, an additional diode means is not required because the output electrode of transistor 32 is connected to a fixed, i.e., non-time varying voltage, here the input signal common mode voltage, i.e, ground.

The switched capacitor circuit 20 includes: a third transistor 40, here a pMOS transistor having a control (gate) electrode fed by PH2, an input electrode coupled to the sampling capacitor Cs at node N2 and an output electrode connected to the reference voltage, VREF, here +2.5 volts; and, a fourth transistor 42 having a gate electrode fed by, an input electrode coupled to node N2 and an output electrode coupled to summing node N3.

In operation, during the charge transfer phase, the voltage at plate P1 of capacitor Cb2 is at +5 volts. Diode means 26 is forward biased because the range of analog input signal voltages is below [+5 volts−VTH]; i.e, below +4 volts. Thus, capacitor Cb2 charges to store a voltage, Vb2, [+5−Vin−VTH] with plate P2 being more negative than plate. During the charging, or sampling phase, the voltage coupled to plate P1 of capacitor Cb2 lowers by here 5 volts, i.e., to ground. Thus, diode 26 opens and the voltage at the control electrode of transistor 21 drops towards ground because of the voltage stored on level shifting capacitor Cb2; i.e., here toward −Vb2, or to a level below Vin by [Vin−(−Vb2)]=[Vin+5−Vin−VTH]=[5−VTH]=4 volts. However, diodes 28 and 30 being now forward biased, conduct and limit the voltage at node N4 to [Vin−2VTH]. Thus, the voltage at the control electrode of transistor 21 is below Vin by 2 volts; a voltage sufficiently below Vin to turn transistor 21 to conduction. Further, node N4 tracks the analog input signal voltage and is clamped to [Vin−2VTH]. It is noted that the sum of threshold voltages of first diode means 26 and the second diode means 28, 30 is preferably less than the difference in the voltages of the control signal PH2; i.e., less than 5 volts. When the analog input signal voltage is at the 0 volt, mid-range voltage, it is noted that node N1 is at this mid-range 0 volt level during both the charging phase and the charge transfer phase. Thus, there will be no net charge to the integrating capacitor $C_{INTGR}$ when the analog input signal voltage is at the mid-range voltage. It should also be noted that when transistor 40 is in conduction during the charging phase, the voltage at the summing node N3 is equal to the reference voltage VREF at the non-inverting input to the operational amplifier A1.

Other embodiments are within the spirit and scope of the appended claims. For example, other supply and reference voltage levels may be used. Further, the second diode means 28 and 30 may be replaced with a resistor, in which case the sum of the voltage produced by the first diode means 26 and across the resistor should be equal to, or less than, the difference between voltages produced for control signal PH2 (i.e., here less than 5 volts). Still further, the first diode means 26 may be replaced with a resistor in which case the sum of the voltage produced by the second diode means 28 and 30 and across the resistor should be equal to or less than the difference between voltages produced for control signal PH2, i.e., here less than 5 volts). Still further, while capacitor Cs is shown as a single capacitor, such may be implemented with a bank of capacitors which may be selectively interconnected to provide a desired capacitance.

What is claimed is:

1. A sampling capacitor interface circuit fed by a supply voltage and connected to store charge on a sampling capacitor related to a sample of an input signal during a charging phase and to transfer the stored charge to an output during a charge transfer phase, such input signal varying over a range of voltages, such input signal varying independently of the supply voltage, comprising:

a first transistor having: an input electrode fed by the input signal; an output electrode coupled to the sampling capacitor; and, a control electrode;

a controller for producing a control signal having a first voltage during the charging phase and a second voltage during the charge transfer phase, such voltages being unipolar voltages supplied by the supply voltage;

a bias circuit coupled to the input signal and having a level shifting capacitor coupled between the controller and the control electrode for storing a voltage during the charge transfer phase and for shifting the first voltage by the stored voltage during the charging phase to provide a voltage at the control electrode with a level sufficient to bias the first transistor to a conducting condition during the charging phase over the range of input signal voltages.

2. The circuit recited in claim 1 wherein the bias circuit includes a first diode means coupled between the input electrode and the control electrode, the first diode means being coupled to conduct and provide a threshold voltage drop relative to the input signal voltage at the level shifting capacitor during an initial portion of the charging phase.

3. The circuit recited in claim 2 wherein the bias circuit includes a second diode means coupled between the input electrode and the control electrode, the first diode means being coupled to conduct and provide a first threshold voltage drop relative to the input signal voltage at the level shifting capacitor during an initial portion of the charging phase and the second diode means being coupled to conduct and provide a second threshold voltage drop relative to the input voltage level at the level shifting during a terminal portion of the charging phase.

4. The circuit recited in claim 3 wherein the sum of the first and second threshold voltages is less than the difference between the first and second voltages.

5. The circuit recited in claim 2 wherein the bias circuit includes a resistor means coupled between the input electrode and the control electrode, the first diode means being coupled to conduct and provide a threshold voltage drop relative to the input signal voltage at the level shifting capacitor during an initial portion of the charging phase and the resistor means being coupled to conduct and provide a voltage drop relative to the input voltage level at the level shifting capacitor during a terminal portion of the charging phase.

6. The circuit recited in claim 5 wherein the sum of the first diode means threshold voltage and the voltage drop provided by the resistor means is less than, or equal to, the difference between the first and second voltages.

7. A sampling capacitor interface circuit connected to store charge on a sampling capacitor related to a sample of an input signal during a charging phase and to transfer the stored charge to an output during a charge transfer phase, comprising:

a first transistor having: an input electrode fed by the input signal; an output electrode coupled to the sampling capacitor; and, a control electrode;

a controller for producing a control signal having a first voltage during the charging phase and a second voltage during the charge transfer phase, such voltages being unipolar voltages;

a bias circuit coupled to the input signal and having a level shifting capacitor coupled between the controller and the control electrode for storing a voltage during the charge transfer chase and for shifting the first voltage by the stored voltage during the charging phase to provide a voltage at the control electrode with a level sufficient to bias the first transistor to a conducting condition during the charging phase over the range of input signal voltages, and wherein the bias circuit includes a first diode means coupled between the input electrode and the control electrode, the first diode means being coupled to conduct and provide a threshold voltage drop relative to the input signal voltage at the level shifting capacitor during an initial portion of the charging phase.

8. The circuit recited in claim 7 wherein the bias circuit includes a second diode means coupled between the input electrode and the control electrode, the first diode means being coupled to conduct and provide a first threshold voltage drop relative to the input signal voltage at the level shifting capacitor during an initial portion of the charging phase and the second diode means being coupled to conduct and provide a second threshold voltage drop relative to the input voltage level at the level shifting during a terminal portion of the charging phase.

9. The circuit recited in claim 8 wherein the sum of the first and second threshold voltages is less than the difference between the first and second voltages.

10. The circuit recited in claim 7 wherein the bias circuit includes a resistor means coupled between the input electrode and the control electrode, the first diode means being coupled to conduct and provide a threshold voltage drop relative to the input signal voltage at the level shifting capacitor during an initial portion of the charging phase and the resistor means being coupled to conduct and provide a voltage drop relative to the input voltage level at the level shifting capacitor during a terminal portion of the charging phase.

11. The circuit recited in claim 10 wherein the sum of the first diode means threshold voltage and the voltage drop provided by the resistor means is less than, or equal to, the difference between the first and second voltages.

12. A sampling capacitor interface circuit connected to store charge on a sampling capacitor related to a sample of an input signal during a charging phase and to transfer the stored charge to an output during a charge transfer phase, comprising:

a first transistor having: an input electrode fed by the input signal; an output electrode coupled to the sampling capacitor; and, a control electrode;

a controller for producing a control signal having a first voltage during the charging phase and a second voltage during the charge transfer phase, such voltages being unipolar voltages;

a bias circuit coupled to the input signal and having a level shifting capacitor coupled between the controller and the control electrode for storing a voltage during the charge transfer phase and for shifting the first voltage by the stored voltage during the charging phase to provide a voltage at the control electrode with a level sufficient to bias the first transistor to a conducting condition during the charging phase over the range of input signal voltages;

wherein the bias circuit includes a first diode means coupled between the input electrode and the control electrode, the first diode means being coupled to conduct and provide a threshold voltage drop relative to the input signal voltage at the level shifting capacitor during an initial portion of the charging phase;

a second transistor having: an input electrode coupled to the output electrode of the first transistor and to the sampling capacitor; an output electrode coupled to a reference voltage; and, a control electrode;

wherein the controller produces a second control signal, such second control signal having a first voltage during the charging phase and a second voltage during the transfer phase, such voltages being unipolar voltages; and a second bias circuit having a level shifting capacitor coupled between the controller and the control electrode of the second transistor for storing, in response to the second control signal, a voltage during the charging phase and for shifting the second voltage of the second control signal by the stored voltage during the charge transfer phase to provide a voltage at the control electrode of the second transistor with a level sufficient to bias the second transistor to a conducting condition during the charge transfer phase over the range of input signal voltages.

13. The circuit recited in claim 12 wherein the input signal has a common mode level, and wherein the second bias circuit includes a diode means coupled between the control electrode of the second transistor and the input signal common mode level to provide a threshold level at the level shifting capacitor of the second bias circuit relative to the input signal common mode level during the charge transfer phase.

14. A sampling capacitor interface circuit connected to store charge on a sampling capacitor related to a sample of an input signal during a charging phase and to transfer the stored charge to an output during a charge transfer phase, such input varying in voltages over an operating range of voltages, comprising:

a unipolar voltage supply, wherein the input voltage varies over the operating range independently of the supply voltage;

a controller for producing a control signal having a pair of switching voltages, such pair of switching voltages being unipolar voltages produced from the unipolar voltage supply;

a first transistor having an input electrode adapted for coupling to the input signal, an output electrode coupled to the sampling capacitor, and a control electrode fed by the control signal, such first transistor being biased by one of the pair of switching voltages to a conducting condition to couple the input signal to the sampling capacitor during the charging phase and being biased by such one of the pair of switching voltages to a non-conducting condition to decouple the input signal from the sampling capacitor during the charge transfer phase;

a bias circuit having a capacitor for storing a voltage during the charge transfer phase and for combining the stored voltage with one of the switching voltages during the charging phase to bias the first transistor to conduction during the charging phase over the operating range of input signal voltages.

15. The sampling capacitor interface circuit recited in claim 14 including:

a second transistor an input electrode coupled to the sampling capacitor and to the output electrode of the first transistor, an output electrode coupled to an input signal common mode level, and a control electrode fed by the controller, such second transistor being biased by a conducting condition to couple the sampling capacitor to the common mode voltage during the charge transfer phase and being biased to a non-conducting condition to decouple the sampling capacitor from the input signal common mode level during the sampling phase;

a second bias circuit having a capacitor for storing a voltage during the charging phase and for combining the stored voltage with the control voltage on the control electrode of the second transistor during the charge transfer phase to provide a voltage at the control electrode to bias the second transistor to conduction during the charge transfer phase.

16. The sampling capacitor interface circuit recited in claim 15 wherein the output electrode of the first transistor and the input electrode of the second transistor are coupled to a first plate of the sampling capacitor and including a third transistor and a fourth transistor, the third transistor having: an input electrode coupled to a second plate of the sampling capacitor; an output electrode coupled to a voltage intermediate ground and the unipolar supply voltage; and a control electrode fed by one of the switching voltages; and the fourth transistor having an input electrode coupled to the second plate of the sampling capacitor, an output electrode coupled to the output of the interface circuit, and a control electrode fed by one of the switching voltages, the switching voltage placing the third transistor in a conducting condition during the charging phase and in a non-conducting condition during the charge transfer phase and placing the fourth transistor in the conducting condition during the charge transfer phase and in the non-conducting condition during the charging phase.

17. A sampling capacitor interface circuit connected to store charge on a sampling capacitor related to a sample of an input signal during a charging phase and to transfer the stored charge to an output during a charge transfer phase, such input varying in voltages over an operating range of voltages, comprising:

a unipolar voltage supply, wherein the input voltage varies over the operating range independently of the supply voltage;

a controller for producing a control signal having a pair of switching voltages, such pair of switching voltages being unipolar voltages produced from the unipolar voltage supply;

a first transistor having an input electrode adapted for coupling to the input signal, an output electrode coupled to the sampling capacitor, and a control electrode fed by the control signal, such first transistor being biased by one of the pair of switching voltages to a conducting condition to couple the input signal to the sampling capacitor during the charging phase and being biased by such one of the pair of switching voltages to a non-conducting condition to decouple the input signal from the sampling capacitor during the charge transfer phase ;

a bias circuit having a capacitor for storing a voltage during the charge transfer phase and for combining the stored voltage with one of the switching voltages during the charging phase to bias the first transistor to conduction during the charging phase over the operating range of input signal voltages;

a second transistor an input electrode coupled to the sampling capacitor and to the output electrode of the first transistor, an output electrode coupled to an input signal common mode level, and a control electrode fed by the controller, such second transistor being biased by a conducting condition to couple the sampling capacitor to the common mode voltage during the charge transfer phase and being biased to a non-conducting condition to decouple the sampling capacitor from the input signal common mode level during the sampling phase; and a second bias circuit having a capacitor for storing a voltage during the charging phase and for combining the stored voltage with the control voltage on the control electrode of the second transistor during the charge transfer phase to provide a voltage at the control electrode to bias the second transistor to conduction during the charge transfer phase.

18. A sampling capacitor interface circuit connected to store charge on a sampling capacitor related to a sample of an input signal during a charging phase and to transfer the stored charge to an output during a charge transfer phase, such input varying in voltages over an operating range of voltages, comprising:

a unipolar voltage supply;

a controller for producing a control signal having a pair of switching voltages, such pair of switching voltages being unipolar voltages produced from the unipolar voltage supply;

a first transistor having an input electrode adapted for coupling to the input signal, an output electrode coupled to the sampling capacitor, and a control electrode fed by the control signal, such first transistor being biased by one of the pair of switching voltages to a conducting condition to couple the input signal to the sampling capacitor during the charging phase and being biased by such one of the pair of switching voltages to a non-conducting condition to decouple the input signal from the sampling capacitor during the charge transfer phase;

a bias circuit having a capacitor for storing a voltage during the charge transfer phase and for combining the stored voltage with one of the switching voltages during the charging phase to bias the first transistor to conduction during the charging phase over the operating range of input signal voltages, and wherein the output electrode of the first transistor and the input electrode of the second transistor are coupled to a first plate of the sampling capacitor and including a third transistor and a fourth transistor, the third transistor having: an input electrode coupled to a second plate of the sampling capacitor; an output electrode coupled to a voltage intermediate ground and the unipolar supply voltage; and a control electrode fed by one of the switching voltages; and the fourth transistor having an input electrode coupled to the second plate of the sampling capacitor, an output electrode coupled to the output of the interface circuit, and a control electrode fed by one of the switching voltages, the switching voltage placing the third transistor in a conducting condition during the charging phase and in a non-conducting condition during the charge transfer phase and placing the fourth transistor in the conducting condition during the charge transfer phase and in the non-conducting condition during the charging phase.

19. A sampling capacitor interface circuit fed by a supply voltage and connected to store charge on a sampling capacitor related to a sample of an input signal during a charging phase and to transfer the stored charge to an output during a charge transfer phase, such input signal varying over a range of voltages, such input signal varying independently of the supply voltage, comprising:

a first transistor having: an input electrode fed by the input signal; an output electrode coupled to the sampling capacitor; and, a control electrode;

a controller for producing a control signal having a first voltage during the charging phase and a second voltage during the charge transfer phase, such voltages being unipolar voltages supplied by the supply voltage;

a bias circuit coupled to the input signal and having a level shifting capacitor coupled between the controller and the control electrode for storing a voltage during the charge transfer phase and for shifting the first voltage by the stored voltage during the charging phase to provide a voltage at the control electrode with a level sufficient to bias the first transistor to a conducting condition during the charging phase over the range of input signal voltages;

a second transistor having: an input electrode coupled to the output electrode of the first transistor and to the sampling capacitor; an output electrode coupled to a reference voltage; and, a control electrode;

wherein the controller produces a second control signal, such second control signal having a first voltage during the charging phase and a second voltage during the transfer phase, such voltages being unipolar voltages;

a second bias circuit having a level shifting capacitor coupled between the controller and the control electrode of the second transistor for storing, in response to the second control signal, a voltage during the charging phase and for shifting the second voltage of the second control signal by the stored voltage during the charge transfer phase to provide a voltage at the control electrode of the second transistor with a level sufficient to bias the second transistor to a conducting condition during the charge transfer phase over the range of input signal voltages.

20. The circuit recited in claim 19 wherein the input signal has a common mode level, and wherein the second bias circuit includes a diode means coupled between the control electrode of the second transistor and the input signal common mode level to provide a threshold level at the level shifting capacitor of the second bias circuit relative to the input signal common mode level during the charge transfer phase.

\* \* \* \* \*